United States Patent [19]

Schade, Jr.

[11] 4,417,160
[45] Nov. 22, 1983

[54] OFFSET COMPENSATION APPARATUS FOR BIASING AN ANALOG COMPARATOR

[75] Inventor: Otto H. Schade, Jr., N. Caldwell, N.J.

[73] Assignee: RCA Corporation, New York, N.Y.

[21] Appl. No.: 288,626

[22] Filed: Jul. 30, 1981

[51] Int. Cl.³ .................. H03K 5/08; G06G 7/186; H03F 1/02
[52] U.S. Cl. .................. 307/353; 307/297; 307/491; 307/496; 330/9
[58] Field of Search .............. 307/491, 494, 496-498, 307/352-354, 359, 362, 246, 579, 577, 585, 297; 323/312-316; 328/127, 151; 330/279, 288, 9

[56] References Cited

U.S. PATENT DOCUMENTS

| | | | |
|---|---|---|---|
| 3,988,689 | 10/1976 | Ochi et al. ............... | 307/353 X |
| 4,110,641 | 8/1978 | Payne ....................... | 307/359 X |
| 4,163,947 | 8/1979 | Weedon ..................... | 307/491 X |
| 4,251,743 | 2/1981 | Hareyama ................. | 307/496 X |
| 4,328,434 | 5/1982 | Geller ....................... | 307/359 |
| 4,377,759 | 3/1983 | Ohhata et al. ............ | 307/494 X |

*Primary Examiner*—Larry N. Anagnos
*Assistant Examiner*—David R. Hudspeth
*Attorney, Agent, or Firm*—E. M. Whitacre; J. S. Tripoli; E. P. Herrmann

[57] ABSTRACT

A threshold comparator for use with a dual slope A/D converter has its input potential established at its threshold potential during auto-zeroing. Potential offset means is included in the auto-zero feedback loop around the integrating and output amplifiers of the A/D circuit. Bias current applied to the potential offset means substantially tracks current passed in the comparator so that the potential developed by the potential offset means substantially tracks the threshold potential of the comparator.

10 Claims, 5 Drawing Figures

OFFSET COMPENSATION APPARATUS FOR BIASING AN ANALOG COMPARATOR

FIELD OF THE INVENTION

This invention relates to analog to digital, A/D, circuitry, and in particular to comparator circuitry for use in an auto-zeroed dual slope system.

BACKGROUND OF THE INVENTION

Typical dual slope A/D converters include the cascade circuit combination of an input buffer amplifier connected to an integrator by a series resistor with the output terminal of the integrator connected to a voltage comparator. The comparator circuit generates an output indication when the integrator output potential crosses a reference level. The circuit also includes digital circuitry for stepping the A/D system through prescribed functions and generating a digital manifestation of the system input parameter being converted. Included in the digital circuitry are a system clock or oscillator and counting circuits.

In operation the dual slope converter first has the unknown parameter, e.g., a voltage to be measured, applied to the input of the buffer amplifier for a preset period. A current, $I=V/R$, proportional to the input voltage flows through the series resistor R and is integrated on an integrating capacitor C developing thereon a potential $V_I = I\Delta t/C$ where $\Delta t$ is the preset period. The preset period is determined by the digital counters counting clock cycles. When the counters reach a preset count limit, the counters are reset and the unknown input potential is removed. At this point in time a reference voltage source is applied to the buffer amplifier input terminal. The reference potential, $V_R$, is arranged to cause a reference current $I_R = V_R/R$ to flow in the series resistor of opposite polarity to the preceding unknown current. The reference current is integrated on the capacitor and discharges the potential thereon. Simultaneous with the application of the reference potential to the buffer amplifier input terminal the counters are conditioned to begin counting. Counting continues until the potential on the integrating capacitor passes through the comparator trip point, typically set at zero potential. A transition of the comparator output signal stops the counters. The accumulated count in the counters is a digital representation of the value of the applied input signal.

One of the advantages of the dual slope type of converter arises from its relatively high insensitivity to temperature and other drift characteristics in the circuit components. Thus changes in the value of the resistance R or the integrating capacitance C will, to a first order, affect the charging cycle of the integrating capacitor in the same manner in which they affect the discharging cycle and hence the conversion factor between voltage and time (counts) stays constant, despite variations in the values of these circuit components. Again, provided that the bias level of the comparator is stabilized at the beginning of the charge cycle, variations in the absolute value of this level should not affect the accuracy or resolution of the conversion. While this basic circuit approach has proven very useful, some problems arise both in terms of the complexity of circuits required to provide stabilization in particular implementations of the dual slope circuit and to the use of the circuit in analog to digital converters which must have auto-polarity, that is, must respond automatically to input voltages of either polarity. These problems may arise, for example, in the complexity of circuits required to establish the comparator reference level with respect to the zero output level from the integrator.

Dual slope A/D converters are typically auto zeroed once per sample or conversion period to eliminate the effect of parameter changes, i.e., drifts, in the integrator and comparator circuits, see for example U.S. Pat. No. 3,654,560 entitled, "Drift Compensated Circuit." In the auto zero mode a feedback loop is closed around the integrator and comparator with the system input at reference potential. The closed loop unity gain output potential (offset) is established and stored on a capacitor as a reference potential for the integrating circuit. Updating circuit offsets each sample period tends to reduce system error due to such drifts or offsets thereby producing a relatively accurate conversion with relatively simple circuitry.

The accuracy of the conversion is dependent upon the circuit gain in the integrator-comparator arrangement. Very high gain is desirable in order to precisely define the comparator switching point. But for the system operating in the auto zero mode the dominant frequency pole is established by the auto zero capacitor, and the capacitance value must necessarily increase for higher values of gain to guarantee system stability. As the auto zero capacitance is increased the system response time is concomitantly increased due to the increased time necessary to establish the offset potential on the capacitor. One solution to the gain-capacitor tradeoff is to remove part of the gain stages from the auto-zero loop during auto zero operation. This allows the use of a smaller auto zero capacitor thereby decreasing the duration of the auto-zero period and thus the overall system response time.

SUMMARY OF THE INVENTION

The present invention is an auto-zeroed dual slope A/D system with a portion of the comparator circuitry outside the auto-zero feedback loop. The system comprises the serial arrangement of an input voltage-to-current converter, a differential amplifier having a capacitor connected between its output terminal and its inverting input terminal to form an integrator, an amplifier following the integrator and a threshold detector following the amplifier. An auto-zero feedback loop is closed around the integrator and the amplifier when the input terminal of the voltage-to-current converter is established at reference potential and system offset potentials are successively stored on a capacitor connected at the differential amplifier non-inverting input terminal. A potential offset means is included in the feedback loop having an offset comparable to the input offset of the threshold detector. The potential offset means is biased in such manner to cause its offset to track input offsets to the threshold detector. The utilization of the potential offset means permits of zeroing the system at the switching point of the threshold detector outside of the feedback loop and accounting for drifts in the input characteristics of the threshold detector inside the auto-zeroed integrator reference potential.

BRIEF DESCRIPTIION OF THE DRAWINGS

Figure 1:
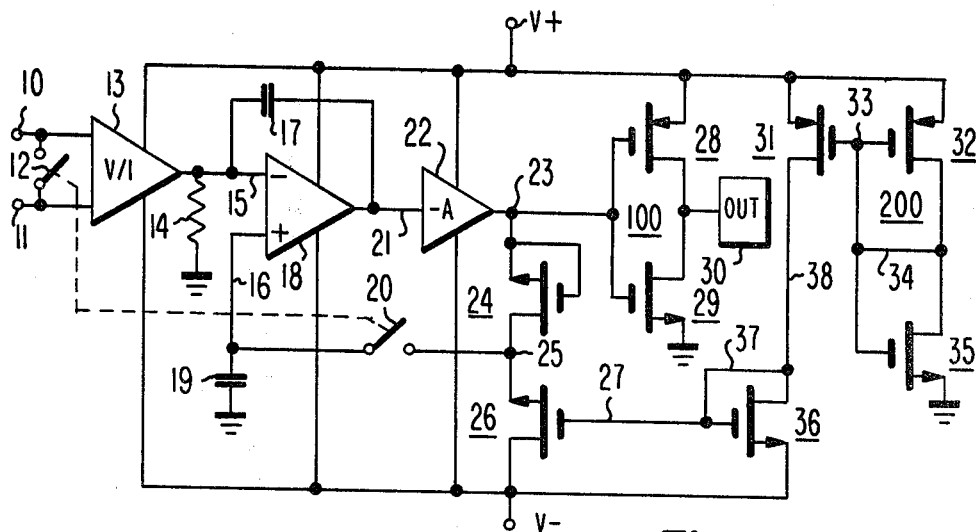
FIG. 1 is a partial schematic; partial block diagram of integrating and comparison circuitry embodying the present invention for performing dual slope A/D conversion.
Figure 3:
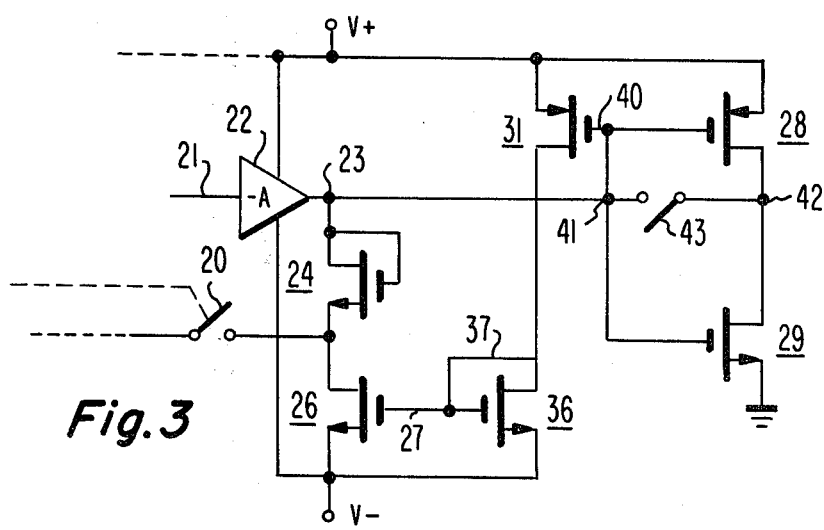
FIGS. 3 and 4 are schematic diagrams of alternate comparator circuits for implementation in the FIG. 1 circuit.
Figure 4:
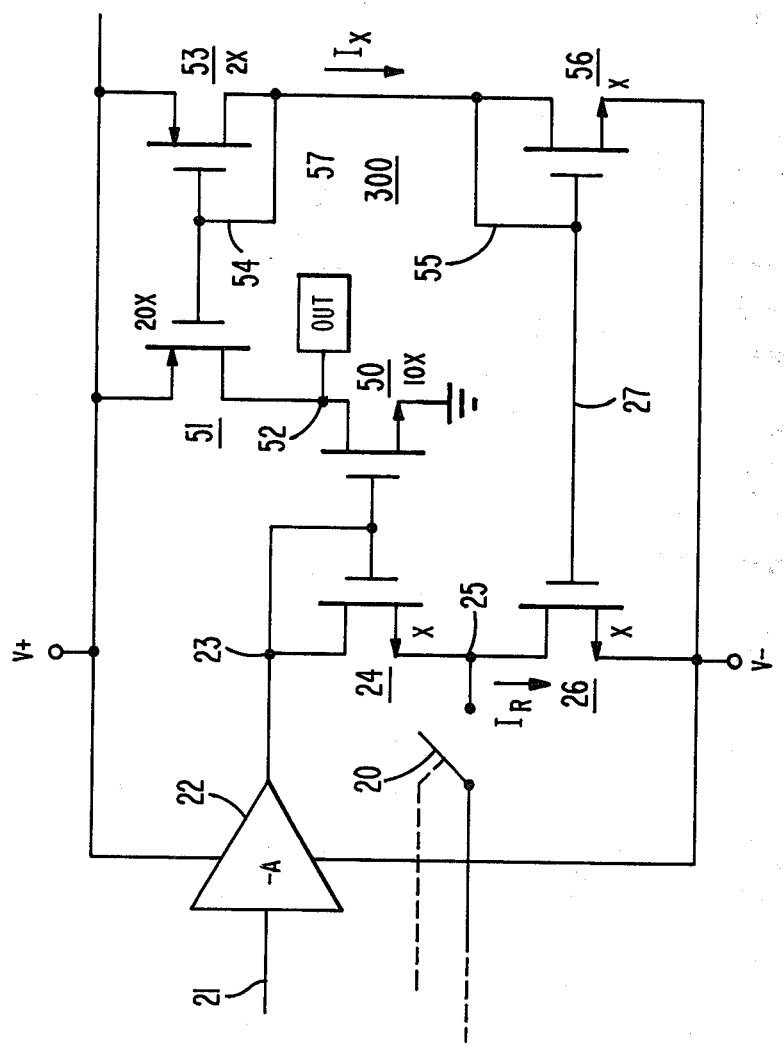

Referring to the drawings, those circuit elements in FIGS. 1, 3 and 4 designated by like numerals are presumed to be the same or similar elements.

The circuit of FIG. 1 illustrates the analog portion of dual slope A/D converter. A potential to be measured is applied between input terminals 10 and 11 of a voltage-to-current converter 13 which produces a current at connection 15 proportional to the applied potential. The current is integrated on capacitor 17 which forms an integration circuit with the differential amplifier 18. A potential proportional to the charge integrated on capacitor 17 occurs at connection 21 and is amplified in the inverting amplifier 22. The amplified potential appears on connection 23 which coincides with the input terminal of the complementary symmetry (CMOS) inverter pair 100 including transistors 28 and 29. Inverter 100 is typically a high gain device and exhibits one of two output states depending upon the value of applied input potential. The inverter output will change states for an input potential excursion through its threshold value typically occurring midway between the supply potential applied across the inverter.

The unknown or variable potential is applied to the input terminals 10 and 11 for a prescribed period developing a potential on capacitor 17 proportional to the applied input potential. At the end of this period a known reference potential is applied between the input terminals 10 and 11. The applied reference potential is poled to cause a discharge of the integrating capacitor 17. The reference potential is constant, thus the discharging current into connection 15 is constant producing a linearly ramped potential at the amplifier output connection 23. When the potential at connection 23 passes through the threshold or trip point potential of the inverter 100, its output potential at terminal 30 changes state. This output state change is utilized by the digital portion of the A/D converter (not shown) to control, for example, the counting and display portions of the system.

Figure 2:
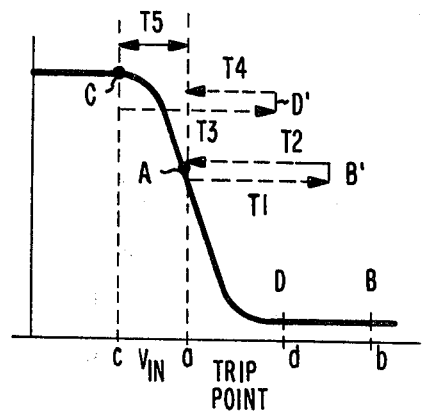
FIG. 2 is a graph of the transfer function of a complementary symmetry field effect transistor inverter.

The accuracy of a system for converting input signals of either polarity depends on the system being regularly auto-zeroed to compensate for parameter drift which produces changing offset potentials in the various elements, and in the inverter 100 being biased in its high gain region. The necessity for the latter bias requirement can be appreciated by reference to FIG. 2 and the following discussion. The curve in FIG. 2 represents the inverter 100 transfer function, the sloped portion corresponding to the gain region of inverter operation. The threshold or trip point of the inverter is designated as point A. By definition an output potential above point A is one output state and an output potential below point A is a second output state. Consider the inverter to be biased at point A when the system is auto-zeroed. Thereafter a potential is applied to the input terminals 10 and 11 for a set period T1 resulting in a positive ramp potential at the inverter 100 input terminal 23 causing a rightward excursion along the FIG. 1 transfer curve to some point B. The time required for thie excursion is represented on the drawing by the broken line T1 between points A-B'. After time T1 the reference signal is applied to input terminals 10 and 11, discharging the integrating capacitor 17 at a constant rate and producing a ramped potential at inverter 100 input terminal 23 which moves leftward from point b to point a represented by an excursion along the transfer function from point B toward point A. When the potential passes through point a/A the output of the inverter 100 by definition changes state. The time period for the potential excursion from b/B to a/A is denoted by the broken line T2. Note that the complete cycle began and terminated at point a/A on the curve.

Now consider the system to be auto-zeroed with the inverter 100 input potential biased at the point c/C on the transfer function. For a like input (as above) potential applied to the input terminals 10 and 11 current is integrated for a time T3=T1 producing an excursion along the transfer function from point C to point D. Subsequently when the reference potential is applied to the input terminals 10 and 11 to discharge the integrating capacitor and thereby to establish a conversion "time," the inverter input potential will only traverse from point d/D to point a/A to effect an output state change. The output should not properly change state, however until returning to its starting or zeroed condition, which in this example corresponds to point "c." The time, T5, representing the time required to complete the integration of the reference current to manifest the potential change from points "a" to "c" represents a system conversion error. A similar error will occur with the auto-zero bias point established anywhere outside the high gain region of the inverter transfer function.

Auto-zeroing the system is performed in the following manner and is performed once each sampling or measuring cycle. Assume the diode connected transistor 24 between connection 23 and 25 in FIG. 1 is short circuited. During auto-zero, switch 12 is closed applying a differential potential of zero volts across input terminals 10 and 11. Concurrently switch 20 is closed applying unity feedback around amplifiers 18 and 22 effectively forming a composite voltage follower including both amplifiers. Offset potentials occurring at connections 15, 21 and 23 are applied cumulatively back to the input terminal 16 of amplifier 18 and stored on the auto-zeroing capacitor 19, which potential is used as a reference potential for the subsequent measuring portion of the cycle. Note that a resistor 14 is connected between the output of voltage-to-current converter 13 to shunt any offset current from the voltage-to-current converter 13 and also to provide a relatively low impedance discharge path for integrating capacitor 17 during auto-zeroing. The latter function of resistor 14 allows for faster discharge of the integration capacitor 17 and thereby faster system zeroing. The former function converts any offset current which may be present from the output of the voltage-to-current converter to an offset voltage for inclusion in the auto-zero reference potential applied to the auto-zero capacitor 19. At the termination of the auto zero period switches 12 and 20 are opened and the potential to be converetd to a digital signal is applied to input terminals 10 and 11.

In order to bias the inverter 100 at its trip point during auto zeroing a comparable offset potential is included in the feedback loop. In the FIG. 1 circuit the inverter 100 biasing offset potential is provided by the transistor 24 connected as a transistor diode with its gate and drain electrodes interconnected at connection 23. In this configuration a drain-source potential is developed across the transistor by a current conducted therethrough, the potential being equivalent to the gate-source potential necessary to support such conduction. Assuming the offset potential produced by voltage-to-current converter 13 at connection 15 is small, i.e., in the order of millivolts, the potential at connection 15 will be near ground potential. Also assuming the gain of the composite amplifier 18 and 22 to be large, the potential between the differential amplifier input connections 15 and 16 will approach zero, thus the potential at connection 16 will be near ground potential. Starting at connection 16 (ground potential) and adding potentials around the feedback loop with switch 20 closed, it is seen that the potential at connection 23 is equal to the potential drop across transistor 24. As will be shown hereinbelow transistor 24 can be biased to exhibit a potential to match the trip point or threshold potential of inverter 100.

Transistor 24 is constructed similarly to transistor 29 of inverter 100. Bias current applied to transistor 24 relative to the transistor's physical dimensions is designed to be similar to current flowing in transistor 29 relative to its physical dimensions when transistor 29 is operating at its trip point. Assuming these conditions are met and both transistors 24 and 29 are in close proximity and subject to like environmental conditions, transistor 24 will track parameter drifts in transistor 29 and consequently such drifts will be compensated in the auto-zero loop by virtue of transistor 24 being included in the feedback circuit.

Bias current for transistor 24 is established by an auxiliary inverter 200 which is biased at its trip point, and the current flowing therein is reflected by current mirrors to transistor 24. CMOS inverter 200 includes p-type transistor 32 having its drain-source conduction path serially connected with the drain-source conduction path of n-type transistor 35. The gate electrodes of the two transistors are interconnected at their drain-source interconnection. The threshold or trip point for the CMOS inverter is typically approximately midway between the supply potential applied across the series connected pair and the inverter output potential for the input biased at threshold is similarly midway between the supply potential. Therefore applying negative feedback from inverter output (drain-source interconnection) to inverter input (gate electrodes) tends to bias the inverted at its threshold potential.

The drain-source potential of transistor 35 having its gate electrode connected to its drain electrode is determined by the drain-source current flowing therein. Transistors of similar geometry, similarly connected and passing similar drain-source current will generate similar drain-source potential. This presumes that the transistors are constructed with identical processes as the case wherein the transistors are produced on an integrated circuit. Under these conditions design differences in current/voltage characteristics are primarily related to relative device geometry, e.g., current conducted in two like biased transistors will be related as the ratio of channel widths (for insulated gate field effect transistors). As a consequence the relative tranconductance of such transistors will be related to their respective channel geometry. Therefore, if the ratio of p-transistor 32 transconductance to n-transistor 35 transconductance of inverter 200 is similar to the ratio of p-transistor 28 to n-transistor 29 transconductance of inverter 100, then the threshold potential developed across transistor 35 will be substantially equal to the potential developed across transistor 29 when inverter 100 is biased at its trip point. In addition if transistors 35 and 29 are maintained in close proximity parametric changes in one should track parametric changes in the other.

Transistor 24 is an n-type device similar to transistors 29 and 35 and has a gate-drain interconnection similar to transistor 35. If the ratio of the drain-source currents conducted in transistors 24 and 35 is equal to the ratio of the relevant geometries or transconductance of transistors 24 and 35 (i.e., channel width and channel length) the drain-source potential across transistor 24 will equal the drain-source potential across transistor 35 and will equal the drain-source potential across 29 when inverter 100 is biased at its trip point. Note that the source electrode of transistor 29 is at ground potential and as stated previously when switch 20 is closed during the auto-zero sequence connection 25 (the source connection of transistor 24) is also at ground potential. Therefore reflecting the drain-source potential of transistor 35 biased at the inverter 200 trip point across the drain-source connection of transistor 24 during auto-zero will establish the potential at connection 23 substantially at the inverter 100 threshold or trip point.

Transistor 32 is constrained to pass the same drain-source current as transistor 35 due to their serial drain-source connection. In addition transistor 32 is interconnected with transistor 31 to form a conventional current mirror amplifier, see for example U.S. Pat. No. 4,199,733. The drain-source current flowing in transistor 31 can be established at any desired proportion of the current in transistor 35 by simple selection of the physical parameters of transistor 31 relative to the physical parameters of transistor 32. The drain-source current flowing in transistor 31 is constrained to flow in transistor 36 because of their series interconnection. Transistor 36 is arranged in a current mirror configuration with transistor 26 so that a desired proportion of the current passed in transistor 36 or 31 (and therefore of the current in transistor 35) may be designed to be conducted in the drain-source conduction path of transistor 26. This same current is directed through the drain-source conduction path of transistor 24 by virtue of the transistor 24 source-transistor 26 drain interconnection to develop the threshold potential therein. From the foregoing, it is seen that a bias point potential may be developed in an auxiliary inverter, similar to a threshold detecting inverter utilized as a comparator, and this potential may be reflected across a further transistor by mirroring the current in the auxiliary inverter in the further transistor and utilized to bias the input connection of the comparator inverter.

The current flows continuously in transistor 24 and not only during the auto-zero period. Therefore it is necessary that the current drive capability of amplifier 22 be sufficient so that its output is not loaded thereby. It should be appreciated that by proper scaling of the geometry of transistor 24 and the current flowing therein that the requisite potential may be developed across transistor 24 with a relatively low amplitude current, minimizing the necessary current drive capability of amplifier 22 and concurrently reducing the power dissipated in the bias circuitry. However, while it is desirable to minimize the current conducted in transistor 24, it must be recognized that the auto zero capacitor 19 is charged through transistor 24 and discharged through transistor 26. Thus there is a speed-power tradeoff to be considered in the overall design regarding the bias current chosen and the amplifier 22 drive capability.

FIG. 3 illustrates an alternate method of generating the bias current for transistor 24. In FIG. 3 the comparator inverter comprising transistors 28 and 29 is used to establish the requisite current. The inverter is equipped with a normally open switch 43 (e.g., a further transistor) between its input 23 and output 42 terminals. During the auto-zero mode the switch 43 is closed completing a negative feedback path around the inverter and biasing the inverter at its trip point. P-type transistor 31 having its gate electrode connected to the gate electrode of p-type transistor 28 forms a current mirror therewith. The drain-source current flowing in transistor 29 is mirrored in the drain-source connection of transistor 31 and subsequently mirrored to the drain-source conduction path of transistor 24 via the action of the current mirror comprising transistors 26 and 36.

Unlike the FIG. 1 circuit the FIG. 3 circuit does not maintain a constant bias current in transistor 24 during the measuring or sampling interval. When switch 43 is open the gate or input potential of transistor 31 follows the output potential of amplifier 22. The current developed in transistor 31 due to this potential and reflected in transistor 24 by the current mirror action of transistors 36 and 26 tends to apply positive feedback to connection 23 aiding potential changes at that point with the effect of reducing the current drive requirements of amplifier 22.

FIG. 4 illustrates a further embodiment of the present invention which is particularly desirable because of the minimum number of transistors required. The comparator inverter in the FIG. 4 circuit comprises the series connection of an active n-type transistor 50 and a p-type transistor 51 connected as a constant current source. Transistor 51 having its drain electrode connected to output terminal 52, its source electrode connected to V+ supply potential and its gate electrode biased with a substantially constant potential (i.e., connected to the output terminal 57 of a self biased inverter 300) is biased with a constant gate-source potential and is thereby conditioned to conduct a constant drain-source current. Transistor 50 has its drain electrode connected to output terminal 52, its source electrode connected to ground potential and its gate electrode connected to the output connection 23 of amplifier 22. The potential at connection 23 being variable, the gate-source potential of transistor 50 is variable and it conducts drain-source current accordingly. The output potential at terminal 52 is dependent upon the percentage of the transistor 51 drain-source current conducted by transistor 50.

An inverter 300 comprising p-type transistor 53 and n-type transistor 56, having their drain-source conduction paths serially connected and their respective gate electrodes interconnected to their respective drain electrodes at terminal 57 is self biased at its threshold or trip point. In the drawing the relative geometric dimensions of the respective transistors are designated in multiples of "x." It can be seen that the ratio of the geometries of transistor 53 to transistor 56 of inverter 300 is the same as the ratio of the geometry of transistor 51 to transistor 50 of the comparator inverter. Transistor 53 and transistor 51 are also connected in current mirror configuration so that the current in transistor 51 is directly proportional to the current conducted in transistor 53. As a consequence the trip point or threshold of the comparator inverter will equal the self bias potential of inverter 300. This potential may be established as an offset potential across the transistor 24 for auto-zeroing purposes by reflecting the appropriate proportion of the inverter 300 current $I_x$ through transistor 24. Inverter 300 n-type transistor 56 is interconnected with n-type transistor 26 in a current mirror configuration. The geometric dimensions of transistors 26 and 56 are equal and therefore transistor 26 will conduct a drain source current $I_R$ equal to $I_x$. This current is conditioned to pass in the drain-source conduction path of transistor 24 by virtue of the transistor 24 source-transistor 26 drain interconnection at 25. Since the transistor 24 geometric dimensions are equal to the dimensions of transistor 56, current $I_R$ will develop a potential across the transistor 24 drain-source electrodes equal to the trip point potential developed across the drain-source electrodes of transistor 56 and therefore equal to the trip point of transistor 50.

In a typical design the dimensions of the transistors 53 and 56 will be as small as the inherent $1/f$ noise generated therein will permit so as to minimize power dissipated in inverter 300. Transistors 50 and 51 will be scaled relative to transistors 56 and 53 to dimensions which will provide sufficient current to drive the A/D digital circuitry connected at terminal 52.

Figure 5:
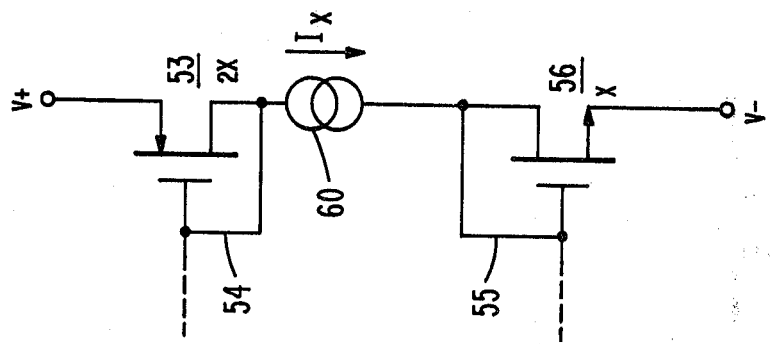
FIG. 5 is a circuit diagram of an alternate current bias generator for use in the FIG. 4 circuit.

FIG. 5 shows an alternate circuit arrangement for generating the gate potentials applied to transistors 51 and 26 of the FIG. 4 circuit. In the FIG. 5 arrangement a current source 60 (or alternatively a resistor or a potential offset means) is interposed between the serially connected drain-source conduction paths of transistors 53 and 56. Current source 60 establishes the current level conducted in transistor 53 and thereby the current conducted in transistor 51 independent of the supply potential. Without the incorporation of current source 60 (or at least a resistor) between transistors 53 and 56 the current rconducted in these transistors increases as the square of supply potential and may become undesirably large depending on the supply potential utilized. The inclusion of the current source 60 (or a resistor) provides an element across which a portion of the supply potential may be developed thereby reducing the gate-source drive potentials of transistors 53 and 56 and thereby limiting the current conducted therein.

In the FIG. 5 transistor 53 having its gate and drain electrodes interconnected generates a potential at connection 54 commensurate with transistor 53 conducting the drain current $I_x$ supplied by source 60. This potential is applied to the gate electrode of transistor 51 which mirrors the current conducted by transistor 53, i.e., with transistors 53 and 51 having relative geometries of 2X and 20X transistor 51 will conduct a drain-source current equal to $10I_x$. Similarly transistor 56 having its gate and drain electrodes interconnected will generate a gate potential at connection 55 commensurate with transistor 56 conducting the drain-source current $I_x$. This potential is applied to the gate electrode of transistor 26. Transistor 26 having common gate and source connections respectively with transistor 56 and having like geometry therewith will mirror the current $I_x$ conducted by transistor 56. During auto zero transistor 26 and 24 will conduct drain-source current $I_x$, and the current conducted in transistor 24 will be mirrored in transistor 50 in the ratio 10:1. Transistors 50 and 51 are therefore seen to conduct equal or balanced currents during auto zero.

What is claimed is:

1. In a potential measuring circuit including input and output circuits and means for selectively closing a negative feedback loop between said input and output circuits for periodically effecting drift voltage compensation of the circuitry connected between and including said input and output circuits, and means in said feedback loop for storing compensating voltages as a reference potential during periods when said feedback loop is open, and including an inverter circuit having an input terminal connected to said output circuitry and an output terminal for producing an output potential, the output potential of said inverter changing from a first to a second state for a potential at its input terminal traversing a threshold value, said circuitry further comprising:

potential offset means serially connected in said feedback loop, said potential offset means connected in the feedback loop at said output circuitry; and means for generating a current to bias said potential offset means to produce an offset potential equal to said inverter threshold level, said bias current varying in amplitude so that the offset potential produced thereby substantially tracks threshold potential drifts occurring in said inverter.

2. The potential measuring circuitry set forth in claim 1 wherein said output circuit includes an amplifier having an input terminal coupled to said input circuitry and having an output terminal connected to the input of said inverter and wherein the inverter includes a first transistor having first, second and control electrodes respectively connected to reference potential, an output terminal of the inverter and the inverter input terminal, current flowing between the first and second electrodes of said first transistor being controlled by the potential between the control and first electrode, and wherein the potential offset means comprises a second transistor similar in type and construction to said first transistor, said second transistor having second and control electrodes connected to the amplifier output terminal and a first electrode connected serially in said feedback loop, the current biasing said second transistor to produce said offset potential equal to said threshold level being applied to the first electrode of said second transistor.

3. The potential measuring circuitry set forth in claim 2 wherein said means for generating further includes circuitry for generating said second transistor bias current comprising:

an auxiliary inverter of similar construction to the inverter for threshold detection including a transistor corresponding to said first transistor, said auxiliary inverter biased at its threshold value;

current mirror means connected with said auxiliary inverter for producing at an output terminal of said current mirror a current proportional to the current conducted by said corresponding transistor; and means connecting the output terminal of said current mirror to the first electrode of said second transistor.

4. In combination:

a voltage-to-current converter having input and output terminals;

means for selectively applying a zero reference potential to the input terminals of the voltage-to-current converter;

a differential amplifier having an inverting input terminal connected to the output terminal of the voltage-to-current converter, having a non-inverting input terminal and an output terminal;

an inverting amplifier having an input terminal connected to the output terminal of the differential amplifier, and having an output terminal;

a threshold inverter including first and second transistors having their principal conduction paths in serial connection, the interconnection of such conduction paths forming an ouput terminal for said threshold inverter, said first and second transistors having respective control electrodes with the control electrode of at least the first transistor being connected to the output terminal of the inverting amplifier, and wherein the first and second transistors are provided with supply potential for normal operation, said threshold inverter exhibiting a change of output state for an input potential excursion at the control electrode of the first transistor attaining a threshold level;

a third transistor similar to said first transistor having one terminal of its principal conduction path and its control electrode connected to the output terminal of said inverting amplifier and having a second terminal of its principal conduction path connected to a first node;

a capacitor connected between the differential amplifier non-inverting input terminal and a point of fixed potential;

means for selectively connecting said first node to the non-inverting input terminal of the differential amplifier;

means for generating a bias current substantially proportional to and substantially tracking variations in the current in said first transistor when the potential at its control electrode is equivalent to the threshold value of the threshold inverter; and means for applying said bias current to said first node wherein the bias current flowing through the principal conduction path of said third transistor produces a potential thereacross equal to the threshold level of said threshold inverter.

5. The combination set forth in claim 4 further including a resistor connected between the output terminal of the voltage-to-current converter and a fixed reference potential.

6. The combination set forth in claim 4 or 5 wherein the means for generating said bias current comprises:

fourth and fifth transistors respectively similar to said first and second transistors having respective first, second and control electrodes, respective principal conduction paths between their respective first and second electrodes and wherein the conduction of the principal conduction paths of the respective transistors is controlled by the potential applied between the control first electrode of the respective transistor, said fourth and fifth transistors having their respective control electrodes connected to their respective second electrodes, and the ratio of transconductance of the fourth and fifth transistors being equal to the ratio of the transconductance of the first and second transistors;

means connecting the second electrode of the fourth transistor to the second electrode of the fifth transistor;

a sixth transistor similar to said fourth transistor having first, second and control electrodes, said control and first electrode of the sixth transistor connected respectively to the control and first electrode of said fourth transistor, said fourth and sixth transistor forming a current mirror;

means connecting the second electrode of said sixth transistor to said first node; and means connecting the control electrodes of said second and fifth transistors.

7. The combination set forth in claim 6 wherein the means connecting the second electrodes of the fourth and fifth transistors includes a constant current source.

8. The combination set forth in claim 6 wherein the means connecting the second electrodes of the fourth and fifth transistors includes a resistor.

9. The combination set forth in claim 4 or 5 wherein the means for generating said bias current comprises;

an auxiliary inverter similar to the threshold inverter including fourth and fifth transistors having respective principal conduction paths serially connected and respective control electrodes connected to the conduction path interconnection, said fourth and fifth transistors being similar to said first and second transistors respectively, and the ratio of the transconductances of the fourth and fifth transistors being equal to the ratio of the transconductances of the first and second transistors and wherein the potential exhibited at the control electrode connection of the fourth and fifth transistors is equal to the threshold level of the threshold inverter and the current conducted in the principal conductance path of said auxiliary inverter transistors is in the same proportion to the current conducted in the principal conductance paths of the threshold inverter transistors as the transconductance of the fifth transistor is to the transconductance of the second transistor;

a sixth transistor of similar type to said fifth transistor and forming a current mirror therewith and generating a current in the principal conduction path of said sixth transistor in like proportion to the current flowing in the fifth transistor as the transconductance of the sixth transistor is to the transconductance of the fifth transistor;

a fourth current mirror amplifier having an input terminal connected to the principal conduction path of said sixth transistor and an output terminal connected to said first node, the gain of the further current mirror being arranged so that the ratio of its output current to the current conducted in the first transistor when biased at threshold is equal to the ratio of the transconductance of the third transistor to the transconductance of the first transistor.

10. The combination set forth in claim 4 or 5 wherein the means for generating the bias current comprises:

switch means for selectively closing a unity gain feedback path between the input and output terminals of the threshold inverter;

a fourth transistor similar to said second transistor having its control electrode connected to the control electrode of the second transistor and forming a current mirror amplifier therewith when the switch means is closed;

a further current mirror amplifier having an input terminal for applying current from a principal conduction path of said fourth transistor and having an output terminal connected to said first node, the output current of the further current mirror amplifier being in the same ratio with the current conducted in said first transistor as the transconductance of the third transistor is to the transconductance of the first transistor.

* * * * *

UNITED STATES PATENT AND TRADEMARK OFFICE
CERTIFICATE OF CORRECTION

PATENT NO. : 4,417,160

DATED : Nov. 22, 1983

INVENTOR(S) : Otto H. Schade, Jr.

It is certified that error appears in the above-identified patent and that said Letters Patent is hereby corrected as shown below:

Column 8, line 36    "rconducted" should be --conducted--.

Column 10, line 32   after "current" insert --conducted--.

Column 10, line 53   after "control" insert --and--.

Signed and Sealed this

Fourteenth Day of February 1984

[SEAL]

Attest:

GERALD J. MOSSINGHOFF

Attesting Officer

Commissioner of Patents and Trademarks